United States Patent
Kim et al.

(10) Patent No.: US 11,315,621 B2
(45) Date of Patent: Apr. 26, 2022

(54) DEVICES ADJUSTING A LEVEL OF AN ACTIVE VOLTAGE SUPPLIED IN A REFRESH OPERATION

(71) Applicant: SK hynix Inc., Icheon-si (KR)

(72) Inventors: Kyung Mook Kim, Icheon-si (KR); Woongrae Kim, Icheon-si (KR); Sang Il Park, Yongin-si (KR); Seung Hun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/009,329

(22) Filed: Sep. 1, 2020

(65) Prior Publication Data

US 2021/0383858 A1 Dec. 9, 2021

(30) Foreign Application Priority Data

Jun. 4, 2020 (KR) .................... 10-2020-0067925

(51) Int. Cl.
*G11C 11/406* (2006.01)
*G11C 11/408* (2006.01)
*G11C 11/4074* (2006.01)

(52) U.S. Cl.
CPC .... *G11C 11/40615* (2013.01); *G11C 11/4074* (2013.01); *G11C 11/4085* (2013.01); *G11C 2211/4068* (2013.01)

(58) Field of Classification Search
None
See application file for complete search history.

(56) References Cited

U.S. PATENT DOCUMENTS

| 6,233,181 | B1* | 5/2001 | Hidaka | G11C 29/808 365/200 |
| 6,426,908 | B1* | 7/2002 | Hidaka | G11C 5/14 365/222 |
| 7,609,566 | B2 | 10/2009 | Im | |
| 9,299,414 | B1* | 3/2016 | Lin | G11C 11/40615 |
| 2004/0071026 | A1* | 4/2004 | Hidaka | H03K 19/0016 365/200 |
| 2013/0051171 | A1* | 2/2013 | Porter | G11C 5/147 365/222 |
| 2020/0227113 | A1* | 7/2020 | Rehmeyer | G11C 11/40618 |

FOREIGN PATENT DOCUMENTS

KR 100922884 B1 10/2009

* cited by examiner

*Primary Examiner* — J. H. Hur
(74) *Attorney, Agent, or Firm* — William Park & Associates Ltd.

(57) ABSTRACT

A device includes an operation control circuit and a drive control signal generation circuit. The operation control circuit generates an internal refresh signal that is activated to perform an active operation for a cell array, the cell array being coupled to a word line that is selected by a row address based on a refresh signal that is activated to perform a refresh operation. In addition, the operation control circuit generates a pre-refresh pulse based on the refresh signal and generates a refresh end pulse based on the internal refresh signal. The drive control signal generation circuit generates a drive control signal to control a drive of an active voltage that is supplied to the word line that is selected by the row address based on the internal refresh signal, the pre-refresh pulse, and the refresh end pulse.

19 Claims, 16 Drawing Sheets

DEVICES ADJUSTING A LEVEL OF AN ACTIVE VOLTAGE SUPPLIED IN A REFRESH OPERATION

CROSS-REFERENCE TO RELATED APPLICATIONS

The present application claims priority under 35 U.S.C 119(a) to Korean Application No. 10-2020-0067925, filed on Jun. 4, 2020, which is incorporated herein by reference in its entirety.

BACKGROUND

1. Technical Field

Embodiments of the present disclosure relate to devices executing a refresh operation and, more particularly, to devices adjusting a level of an active voltage supplied in a refresh operation.

2. Related Art

Unlike static random access random (SRAM) devices and flash memory devices, dynamic random access random (DRAM) devices of semiconductor devices may lose information (i.e., data) that is stored in cell arrays thereof as time elapses even though power is supplied. Thus, the DRAM devices may periodically perform an active operation to sense and amplify levels of the data that is stored in the cell arrays in order to prevent data loss in the cell arrays, and the active operation to sense and amplify the levels of the data that is stored in the cell arrays may be referred to as a refresh operation. The refresh operation may be performed by activating word lines in the cell arrays at least once within a data retention time of the memory cells that are disposed in the cell arrays in a bank to sense and amplify the levels of the data. The data retention time may correspond to a maximum time that the memory cells can retain minimum charges that are required to reveal original data without any refresh operations.

SUMMARY

According to an embodiment, a device includes an operation control circuit and a drive control signal generation circuit. The operation control circuit is configured to generate an internal refresh signal that is activated to perform an active operation for a cell array, the cell array being coupled to a word line that is selected by a row address based on a refresh signal that is activated to perform a refresh operation. In addition, the operation control circuit is configured to generate a pre-refresh pulse based on the refresh signal and is configured to generate a refresh end pulse based on the internal refresh signal. The drive control signal generation circuit is configured to generate a drive control signal to control a drive of an active voltage that is supplied to the word line that is selected by the row address based on the internal refresh signal, the pre-refresh pulse, and the refresh end pulse.

According to another embodiment, a device includes a refresh pulse generation circuit, an internal refresh signal generation circuit, a refresh end pulse generation circuit, and a drive control signal generation circuit. The refresh pulse generation circuit is configured to generate a refresh pulse during each internal refresh cycle that is set based on a refresh clock signal that is generated when a refresh signal is activated and is configured to generate a pre-refresh pulse before the refresh pulse is generated. The internal refresh signal generation circuit is configured to generate an internal refresh signal based on a start pulse that is generated when the refresh signal is activated and the refresh pulse. The refresh end pulse generation circuit is configured to generate a refresh end pulse based on the internal refresh signal. The drive control signal generation circuit is configured to generate a drive control signal to control a drive of an active voltage that is supplied to a word line that is selected by a row address based on the internal refresh signal, the pre-refresh pulse, and the refresh end pulse.

According to yet another embodiment, a device includes a refresh clock generation circuit, a refresh pulse generation circuit, an internal refresh signal generation circuit, a refresh end pulse generation circuit, and a drive control signal generation circuit. The refresh clock generation circuit is configured to generate a refresh clock signal whose cycle is adjusted based on a temperature code when a refresh signal is activated. The refresh pulse generation circuit is configured to generate a refresh pulse during each internal refresh cycle that is set based on the refresh clock signal and is configured to generate a pre-refresh pulse before the refresh pulse is generated. The internal refresh signal generation circuit is configured to generate an internal refresh signal based on a start pulse that is generated when the refresh signal is activated and the refresh pulse. The refresh end pulse generation circuit is configured to generate a refresh end pulse based on the internal refresh signal. The drive control signal generation circuit is configured to generate a drive control signal to control a drive of an active voltage that is supplied to a word line that is selected by a row address based on the internal refresh signal, the pre-refresh pulse, and the refresh end pulse.

DETAILED DESCRIPTION OF THE EMBODIMENTS

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level that is higher than a voltage level of the logic "low" level. Meanwhile, logic levels of signals may be set to be different or opposite according to the embodiments. For example, a certain signal with a logic "high" level in one embodiment may be set to a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
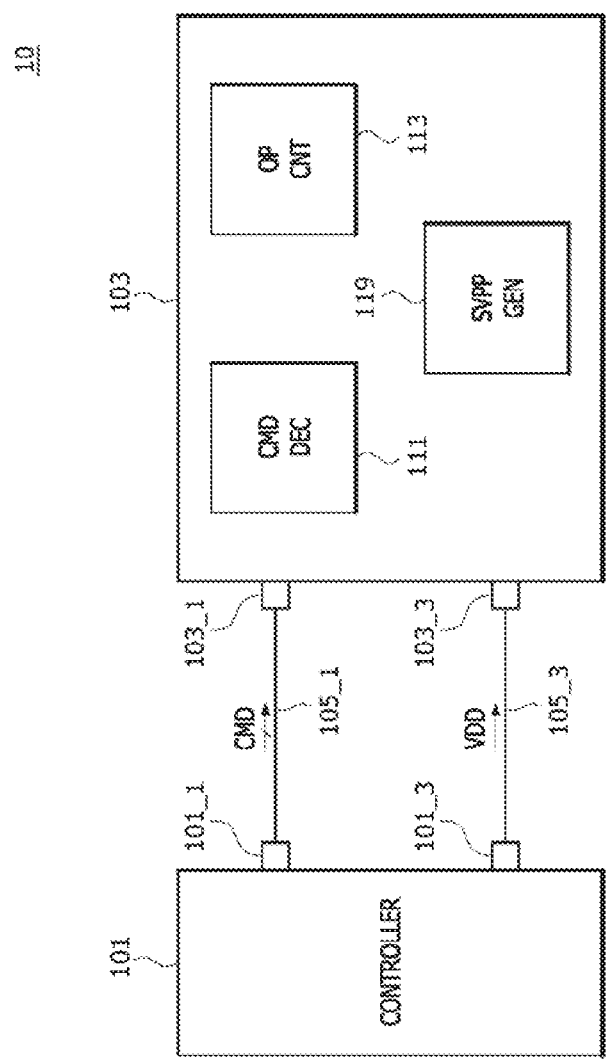
FIG. 1 is a block diagram, illustrating a configuration of a system, according an embodiment of the present disclosure.

FIG. 1 is a block diagram, illustrating a configuration of a system 10, according an embodiment of the present disclosure. As illustrated in FIG. 1, the system 10 may include a controller 101 and a device 103. The controller 101 may include a first control pin 101_1 and a second control pin 1013. The device 103 may include a first device pin 103_1 and a second device pin 103_3. The controller 101 may transmit a command CMD to the device 103 through a first transmission line 105_1, connecting the first control pin 101_1 to the first device pin 103_1. The controller 101 may supply a power supply voltage VDD to the device 103 through a second transmission line 1053, connecting the second control pin 101_3 to the second device pin 103_3. In the present embodiment, the command CMD may include a plurality of bits. In some embodiments, the command CMD may be transmitted together with an address through the same transmission line.

The device 103 may be realized by using a semiconductor device. The device 103 may include a command decoder (CMD_DEC) 111 that receives the command CMD from the controller 101 and decodes the command CMD to generate a refresh signal (SREF of FIG. 2) to perform a refresh operation. The refresh operation may be performed by sequentially accessing the cell arrays that are included in the device 103, by executing an active operation for sensing, and by amplifying levels of data that is stored in the accessed cell array. The accessed cell array means a cell array, coupled to a word line that is selected by a row address (RADD of FIG. 2), to be driven by an active voltage (SVPP of FIG. 2). The device 103 may include an operation control circuit (OP_CNT) 113 that controls the active operations of the cell arrays that are sequentially accessed based on a refresh clock signal (TOSC of FIG. 2) when the refresh operation is performed. The refresh clock signal TOSC may be generated to have a cycle that is adjusted based on an internal temperature of the device 103. For example, a cycle of the refresh clock signal TOSC may become increased as the internal temperature of the device 103 is lowered. The device 103 may include an active voltage generation circuit (SVPP_GEN) 119 adjusting a level of the active voltage (SVPP of FIG. 2) that is suppled to a word line when the refresh operation is performed. For example, the active voltage generation circuit 119 may generate the active voltage SVPP with a high level only when the active operation for memory cells that are accessed during the refresh operation is performed, thereby reducing power consumption of the device 103. That is, it may be possible to reduce the amount of current leakage, such as a junction current leakage due to a gate induced drain leakage (GIDL) phenomenon of cell transistors included in non-accessed cells.

Figure 2:
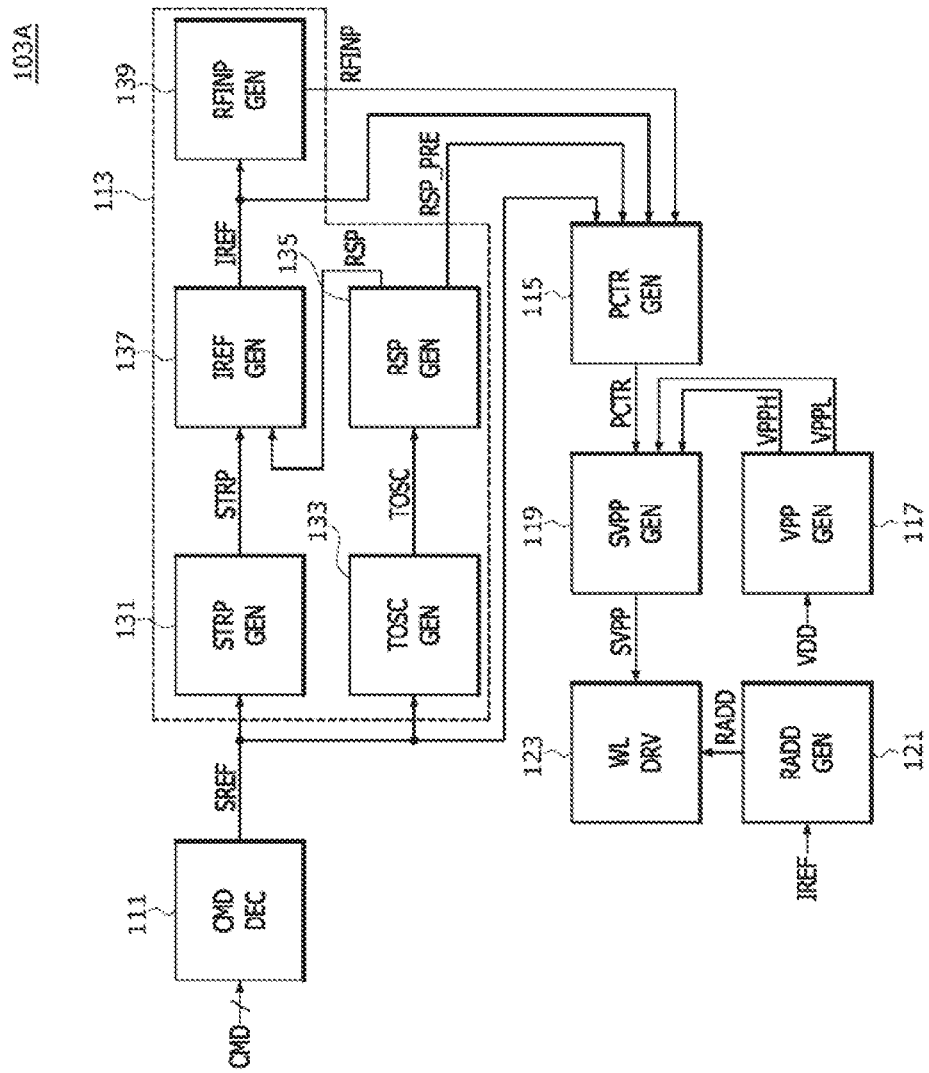
FIG. 2 is a block diagram, illustrating a configuration of an example of a device, included in the system, illustrated in FIG. 1.

FIG. 2 is a block diagram, illustrating a configuration of a device 103A that corresponds to an example of the device 103, included in the system 10, illustrated in FIG. 1. As illustrated in FIG. 2, the device 103A may include the command decoder 111, the operation control circuit 113, a drive control signal generation circuit (PCTR_GEN) 115, an internal voltage generation circuit (VPP_GEN) 117, the active voltage generation circuit (SVPP_GEN) 119, a row address generation circuit (RADD_GEN) 121, and a word line drive circuit (WL_DRV) 123.

The command decoder 111 may receive the command CMD from the controller 101. The command decoder 111 may decode the command CMD to generate the refresh signal SREF to perform the refresh operation. The command decoder 111 may generate the refresh signal SREF that is activated based on a logic level combination of bits included in the command CMD while the refresh operation is being performed. In the present embodiment, although the refresh signal SREF is generated to maintain an activated state with a logic "high" level from a point in time in which the refresh operation starts until a point in time in which the active operations for all of the cell arrays included in the device 103A terminate, the present disclosure is not limited thereto.

The operation control circuit 113 may receive the refresh signal SREF from the command decoder 111. The operation control circuit 113 may generate an internal refresh signal IREF, a refresh pulse RSP, a pre-refresh pulse RSP_PRE, and a refresh end pulse RFINP based on the refresh signal SREF. The operation control circuit 113 may generate the internal refresh signal IREF that is activated to execute the active operation for a cell array that is accessed based on the row address RADD when the refresh signal SREF is activated. The operation control circuit 113 may generate the refresh clock signal TOSC when the refresh signal SREF is activated and may generate the refresh pulse RSP during each internal refresh cycle that is set by the refresh clock signal TOSC. The operation control circuit 113 may generate the internal refresh signal IREF that is activated to execute the active operation for a cell array that is accessed based on the row address RADD whenever the refresh pulse RSP is generated. The operation control circuit 113 may generate the pre-refresh pulse RSP_PRE before the refresh pulse RSP is generated during each internal refresh cycle that is set by the refresh clock signal TOSC. In an embodiment, the pre-refresh pulse RSP_PRE may be generated before the active operation for a cell array that is accessed by the row address RADD is performed. The operation control circuit 113 may generate the refresh end pulse RFINP when the active operation for a cell array terminates based on the internal refresh signal IREF. The operation control circuit 113 may generate the refresh end pulse RFINP in synchronization with a point in time in which the internal refresh signal IREF is deactivated by termination of the active operations for the cell arrays.

The operation control circuit 113 may include a start pulse generation circuit (STRP_GEN) 131, a refresh clock generation circuit (TOSC_GEN) 133, a refresh pulse generation circuit (RSP_GEN) 135, an internal refresh signal generation circuit (IREF_GEN) 137, and a refresh end pulse generation circuit (RFINP_GEN) 139.

The start pulse generation circuit 131 may receive the refresh signal SREF from the command decoder 111. The start pulse generation circuit 131 may generate a start pulse STRP when the refresh signal SREF is activated. In the present embodiment, the start pulse STRP may be generated to have a logic "high" level. However, in some other embodiments, a logic level of the start pulse STRP is not limited to a logic "high" level.

The refresh clock generation circuit 133 may receive the refresh signal SREF from the command decoder 111. The refresh clock generation circuit 133 may generate the refresh clock signal TOSC when the refresh signal SREF is activated. Although a cycle of the refresh clock signal TOSC is set to be constant in the present embodiment, the present disclosure is not limited thereto.

The refresh pulse generation circuit 135 may receive the refresh clock signal TOSC from the refresh clock generation circuit 133. The refresh pulse generation circuit 135 may generate the refresh pulse RSP during each internal refresh cycle that is set by the refresh clock signal TOSC. The refresh pulse RSP may be created to generate the internal refresh signal IREF that is activated to perform the active operation for a cell array that is accessed based on the row address RADD. The refresh pulse generation circuit 135 may generate the pre-refresh pulse RSP_PRE before the refresh pulse RSP is generated. The pre-refresh pulse RSP_PRE may be generated before the active operation for a cell array that is accessed by the row address RADD is performed.

The internal refresh signal generation circuit 137 may receive the start pulse STRP from the start pulse generation circuit 131 and may receive the refresh pulse RSP from the refresh pulse generation circuit 135. The internal refresh signal generation circuit 137 may generate the internal refresh signal IREF that is activated when the start pulse STRP or the refresh pulse RSP is generated. The internal refresh signal generation circuit 137 may generate the internal refresh signal IREF that is activated when the refresh signal SREF is activated to create the start pulse STRP. The internal refresh signal generation circuit 137 may generate the internal refresh signal IREF that is activated when the refresh pulse RSP is generated during each internal refresh cycle that is set by the refresh clock signal TOSC. Although the internal refresh signal IREF is set to be activated during the active operation for a cell array that is accessed by the row address RADD in the present embodiment, the present disclosure is not limited thereto.

The refresh end pulse generation circuit 139 may receive the internal refresh signal IREF from the internal refresh signal generation circuit 137. The refresh end pulse generation circuit 139 may generate the refresh end pulse RFINP when the active operations for cell arrays terminate based on the internal refresh signal IREF. Although the refresh end pulse RFINP is generated when level transition of the internal refresh signal IREF occurs from an activated state with a logic "high" level into an deactivated state with a logic "low" level (i.e., in synchronization with a falling edge of the internal refresh signal IREF) in the present embodiment, the present disclosure is not limited thereto. For example, in some other embodiments, the refresh end pulse RFINP may be generated in synchronization with a rising edge of the internal refresh signal IREF.

The drive control signal generation circuit 115 may receive the refresh signal SREF from the command decoder 111. The drive control signal generation circuit 115 may receive the pre-refresh pulse RSP_PRE, the internal refresh signal IREF, and the refresh end pulse RFINP from the operation control circuit 113. More specifically, the drive control signal generation circuit 115 may receive the pre-refresh pulse RSP_PRE from the refresh pulse generation circuit 135, may receive the internal refresh signal IREF from the internal refresh signal generation circuit 137, and may receive the refresh end pulse RFINP from the refresh end pulse generation circuit 139. The drive control signal generation circuit 115 may generate a drive control signal PCTR that is set to a first logic level based on the refresh signal SREF that is deactivated before the refresh operation is performed. The drive control signal generation circuit 115 may generate the drive control signal PCTR that is set to the first logic level when the refresh signal SREF is activated for the refresh operation and the internal refresh signal IREF is activated by the start pulse STRP. The drive control signal generation circuit 115 may generate the drive control signal PCTR with the first logic level during a period from a point in time in which the pre-refresh pulse RSP_PRE is generated until a point in time in which the refresh end pulse RFINP is generated while the refresh operation is being performed. The drive control signal generation circuit 115 may generate the drive control signal PCTR with the first logic level while the active operation for a cell array that is accessed by the row address RADD is being performed. The drive control signal generation circuit 115 may generate the drive control signal PCTR with a second logic level when the internal refresh signal IREF is deactivated and the pre-refresh pulse RSP_PRE is not generated while the refresh operation is being performed. The drive control signal generation circuit 115 may generate the drive control signal PCTR with a second logic level while the active operation for a call array that is accessed by the row address RADD is not being performed. In the present embodiment, the first logic level may be set to be a logic "low" level, and the second logic level may be set to be a logic "high" level. However, the present disclosure is not limited to the example in which the first logic level is a logic "low" level and the second logic level is a logic "high" level.

The internal voltage generation circuit 117 may receive the power supply voltage VDD from the controller 101. The internal voltage generation circuit 117 may generate a first internal voltage VPPH and a second internal voltage VPPL based on the power supply voltage VDD. The internal voltage generation circuit 117 may be realized by using a charge pumping circuit such that the levels of the first internal voltage VPPH and the second internal voltage VPPL are higher than the level of the power supply voltage VDD. In the present embodiment, the first internal voltage VPPH may be set to a level that is higher than the level of the second internal voltage VPPL.

The active voltage generation circuit 119 may receive the drive control signal PCTR from the drive control signal generation circuit 115. The active voltage generation circuit 119 may generate the active voltage SVPP that is driven to the first internal voltage VPPH or the second internal voltage VPPL based on the drive control signal PCTR. The active voltage generation circuit 119 may drive the active voltage SVPP to the first internal voltage VPPH when the drive control signal PCTR has the first logic level based on the refresh signal SREF that is deactivated before the refresh operation is performed. The active voltage generation circuit 119 may drive the active voltage SVPP to the first internal voltage VPPH when the drive control signal PCTR has the first logic level based on the refresh signal SREF that is activated and the internal refresh signal IREF that is activated by the start pulse STRP. The active voltage generation circuit 119 may drive the active voltage SVPP to the first internal voltage VPPH when the drive control signal PCTR has the first logic level during a period from a point in time in which the pre-refresh pulse RSP_PRE is generated until a point in time in which the refresh end pulse RFINP is generated. The active voltage generation circuit 119 may drive the active voltage SVPP to the first internal voltage VPPH when the drive control signal PCTR is set to the first logic level by the active operation for a cell array that is accessed by the row address RADD. The active voltage generation circuit 119 may drive the active voltage SVPP to the second internal voltage VPPL when the drive control signal PCTR is set to the second logic level by the internal refresh signal IREF that is deactivated and the pre-refresh pulse RSP_PRE that is not generated while the refresh operation is being performed. The active voltage generation circuit 119 may drive the active voltage SVPP to the second internal voltage VPPL when the drive control signal PCTR is set to the second logic level by non-execution of the active operations for cell arrays. The active voltage generation circuit 119 may drive the active voltage SVPP to the second internal voltage VPPL lower than the first internal voltage VPPH while no active operation is performed, thereby reducing power consumption of the device 103A. That is, it may be possible to reduce an amount of current leakage such as a junction current leakage due to a gate induced drain leakage (GIDL) phenomenon of cell transistors included in the device 103A.

The row address generation circuit 121 may receive the internal refresh signal IREF from the internal refresh signal generation circuit 137. The row address generation circuit 121 may generate the row address RADD based on the internal refresh signal IREF. The row address generation circuit 121 may generate the row address RADD that is sequentially counted whenever the internal refresh signal IREF is activated. More specifically, the row address generation circuit 121 may generate the row address RADD with a first combination R1 to supply the active voltage SVPP to a first word line included in the device 103A when the internal refresh signal IREF is activated a first time and may generate the row address RADD with a second combination R2 to supply the active voltage SVPP to a second word line included in the device 103A when the internal refresh signal IREF is activated a second time. When the number of word lines included in the device 103A is "N", the row address generation circuit 121 may generate the row address RADD with an $N^{th}$ combination RAN to supply the active voltage SVPP to an $N^{th}$ word line included in the device 103A when the internal refresh signal IREF is activated an $N^{th}$ time (where, the number "N" may be set to be a natural number). The row address generation circuit 121 may count the row address RADD based on the internal refresh signal IREF until the active operations for all of cell arrays included in the device 103A are performed.

The word line drive circuit 123 may receive the active voltage SVPP from the active voltage generation circuit 119 and may receive the row address RADD from the row address generation circuit 121. The word line drive circuit 123 may supply the active voltage SVPP to a certain word line to perform the active operation for a cell array that is coupled to the certain word line that is selected by the row address RADD. For example, when a first word line is selected by the row address RADD with the first combination R1, the word line drive circuit 123 may supply the active voltage SVPP to the first word line to perform the active operation for a cell array that is coupled to the first word line. In an embodiment, when the active operation for a cell array that is coupled to a first word line is performed, the active voltage SVPP supplied to the first word line may be driven to the first internal voltage VPPH that is higher than the second internal voltage VPPL. While the refresh operation is being performed, the active voltage SVPP supplied to a word line may be driven to the first internal voltage VPPH only when the active operation for a cell array that is coupled to the word line is performed and the active voltage SVPP may be driven to the second internal voltage VPPL lower than the first internal voltage VPPH when the active operation is not performed. As a result, it may be possible to reduce power consumption of the device 103A.

Figure 3:
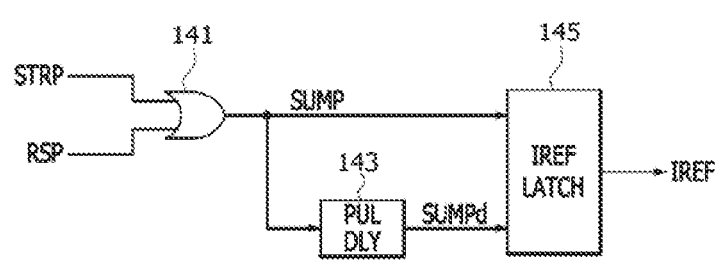
FIG. 3 illustrates an example of an internal refresh signal generation circuit, included in the device, illustrated in FIG. 2.

FIG. 3 illustrates a configuration of the internal refresh signal generation circuit 137. As illustrated in FIG. 3, the internal refresh signal generation circuit 137 may include an OR gate 141, a pulse delay circuit (PUL_DLY) 143, and an internal refresh signal latch circuit (IREF_LATCH) 145. The OR gate 141 may perform a logical OR operation of the start pulse STRP and the refresh pulse RSP to generate a synthesis pulse SUMP. The OR gate 141 may generate the synthesis pulse SUMP with a logic "high" level when the start pulse STRP or the refresh pulse RSP has a logic "high" level. The pulse delay circuit 143 may delay the synthesis pulse SUMP to generate a delayed synthesis pulse SUMPd. In the present embodiment, a delay time of the synthesis pulse SUMP delayed by the pulse delay circuit 143 may be set to be equal to a period that the active operation for a cell array is performed. However, a delay time of the synthesis pulse SUMP delayed by the pulse delay circuit 143 is not limited to the present embodiment. The internal refresh signal latch circuit 145 may generate the internal refresh signal IREF that is activated during a period from a point in time in which the synthesis pulse SUMP is generated until a point in time in which the delayed synthesis pulse SUMPd is generated. The internal refresh signal IREF may be generated when the start pulse STRP is generated by the refresh signal SREF that is activated. The internal refresh signal IREF may be activated whenever the refresh pulse RSP is generated during each internal refresh cycle that is set by the refresh clock signal TOSC. The internal refresh signal IREF may be activated during the active operation for a cell array that is accessed by the row address RADD.

Figure 4:
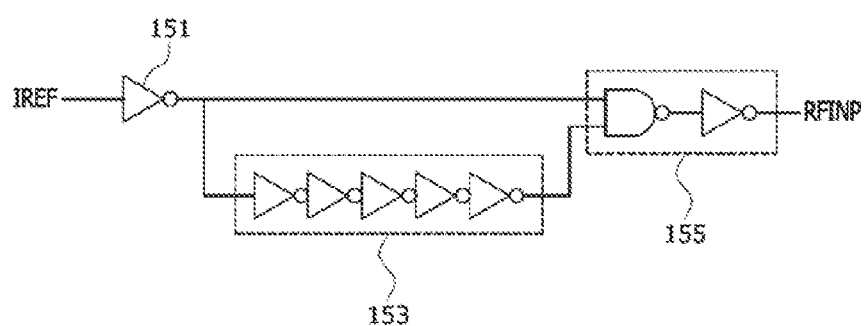
FIG. 4 is a circuit diagram, illustrating an example of a refresh end pulse generation circuit, included in the device, illustrated in FIG. 2.

FIG. 4 is a circuit diagram illustrating a configuration of the refresh end pulse generation circuit 139. As illustrated in FIG. 4, the refresh end pulse generation circuit 139 may include an inverter 151, an inversion/delay circuit 153, and a pulse output circuit 155. The inverter 151 may inversely buffer the internal refresh signal IREF to output the inversely buffered signal of the internal refresh signal IREF. The inversion/delay circuit 153 may include odd number of inverters that are coupled in series and may delay and invert an output signal of the inverter 151 to output the delayed and inverted signal of the output signal of the inverter 151. The pulse output circuit 155 may perform a logic AND operation of an output signal of the inverter 151 and an output signal of the inversion/delay circuit 153 to generate the refresh end pulse RFINP. The refresh end pulse RFINP may be generated in synchronization with a point in time in which a level of the internal refresh signal IREF changes from a logic "high" level into a logic "low" level (i.e., in synchronization with a falling edge of the internal refresh signal IREF). The refresh end pulse RFINP may be generated in synchronization with a point in time in which the active operations for cell arrays accessed by the row address RADD terminate.

Figure 5:
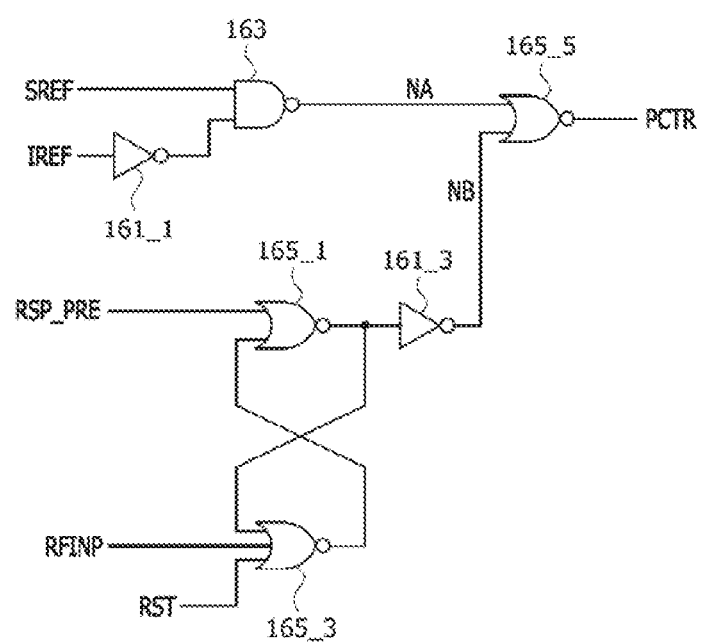
FIG. 5 is a circuit diagram, illustrating an example of a drive control signal generation circuit, included in the device, illustrated in FIG. 2.

FIG. 5 is a circuit diagram, illustrating a configuration of the drive control signal generation circuit 115. As illustrated in FIG. 5, the drive control signal generation circuit 115 may include inverters 161_1 and 161_3, a NAND gate 163, and NOR gates 165_1, 165_3, and 165_5. The inverter 161_1 may inversely buffer the internal refresh signal IREF to output the inversely buffered signal of the internal refresh signal IREF. The NAND gate 163 may perform a logical NAND operation of the refresh signal SREF and an output signal of the inverter 161_1 to generate a first state signal NA. The first state signal NA may be activated to a logic "high" level while the refresh signal SREF is deactivated to a logic "low" level before the refresh operation is performed. The first state signal NA may be set to a logic "high" level when the internal refresh signal IREF is activated to a logic "high" level while the refresh signal SREF is activated to a logic "high" level for execution of the refresh operation. The first state signal NA may be set to a logic "low" level when the internal refresh signal IREF is deactivated to a logic "low" level while the refresh signal SREF is activated to a logic "high" level. The NOR gate 165_1 may perform a logic NOR operation of the pre-refresh pulse RSP_PRE and an output signal of the NOR gate 165_3. The NOR gate 165_3 may perform a logic NOR operation of the refresh end pulse RFINP, a reset signal RST, and an output signal of the NOR gate 165_1. The inverter 161_3 may inversely buffer an output signal of the NOR gate 165_1 to output the inversely buffered signal of the output signal of the NOR gate 165_1 as a second state signal NB. The reset signal RST may be generated to have a logic "high" level during an initialization operation of the device 103A. The second state signal NB may be set to a logic "high" level during a period from a point in time in which the pre-refresh pulse RSP_PRE is generated to have a logic "high" level until a point in time in which the refresh end pulse RFINP is generated to have a logic "high" level. The second state signal NB may be set to a logic "low" level when the reset signal RST is generated to have a logic "high" level for the initialization operation. The NOR gate 165_5 may perform a logical NOR operation of the first state signal NA and the second state signal NB to generate the drive control signal PCTR. The drive control signal PCTR may be set to a logic "low" level based on the refresh signal SREF that is deactivated to a logic "low" level before the refresh operation is performed. The drive control signal PCTR may be set to a logic "low" level when the refresh signal SREF is activated to a logic "high" level for the refresh operation and the internal refresh signal IREF is activated to a logic "high" level by the start pulse STRP. The drive control signal PCTR may be set to a logic "low" level during a period from a point in time in which the pre-refresh pulse RSP_PRE is generated until a point in time in which the refresh end pulse RFINP is generated. The drive control signal PCTR may be set to a logic "high" level when the internal refresh signal IREF is deactivated to a logic "low" level and the pre-refresh pulse RSP_PRE is not generated while the refresh operation is being performed.

Figure 6:
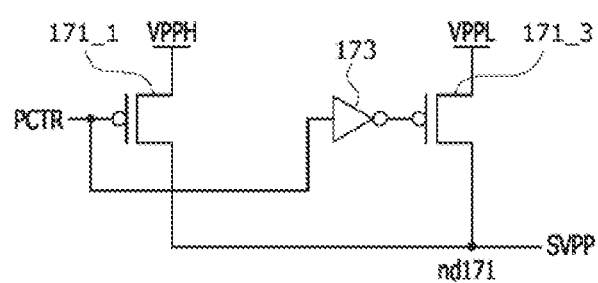
FIG. 6 is a circuit diagram, illustrating an example of an active voltage generation circuit, included in the device, illustrated in FIG. 2.

FIG. 6 is a circuit diagram illustrating a configuration of the active voltage generation circuit 119. As illustrated in FIG. 6, the active voltage generation circuit 119 may include PMOS transistors 171_1 and 171_3 and an inverter 173. The PMOS transistor 171_1 may be coupled between a supply terminal of the first internal voltage VPPH and a node nd171 through that the active voltage SVPP is outputted and may be turned on based on the drive control signal PCTR. The PMOS transistor 171_1 may be turned on to drive the active voltage SVPP to the first internal voltage VPPH when the drive control signal PCTR has a logic "low" level. The inverter 173 may inversely buffer the drive control signal PCTR to output the inversely buffered signal of the drive control signal PCTR. The PMOS transistor 171_3 may be coupled between a supply terminal of the second internal voltage VPPL and the node nd171 through that the active voltage SVPP is outputted and may be turned on based on an output signal of the inverter 173. The PMOS transistor 171_3 may be turned on to drive the active voltage SVPP to the second internal voltage VPPL when the drive control signal PCTR has a logic "high" level. The active voltage generation circuit 119 may drive the active voltage SVPP to the first internal voltage VPPH when the drive control signal PCTR is set to a logic "low" level by the execution of the active operation for a cell array that is accessed by the row address RADD. The active voltage generation circuit 119 may drive the active voltage SVPP to the second internal voltage VPPL when the drive control signal PCTR is set to a logic "high" level by non-execution of the active operation for a cell array. While the active operation for a cell array is not being performed, the active voltage generation circuit 119 may drive the active voltage SVPP to the second internal voltage VPPL, which is lower than the first internal voltage VPPH, to reduce current leakage of the device 103A. As a result, it may be possible to reduce the power consumption of the device 103A.

FIGS. 7 to 14 illustrate an operation of the device 103A.

Figure 7:
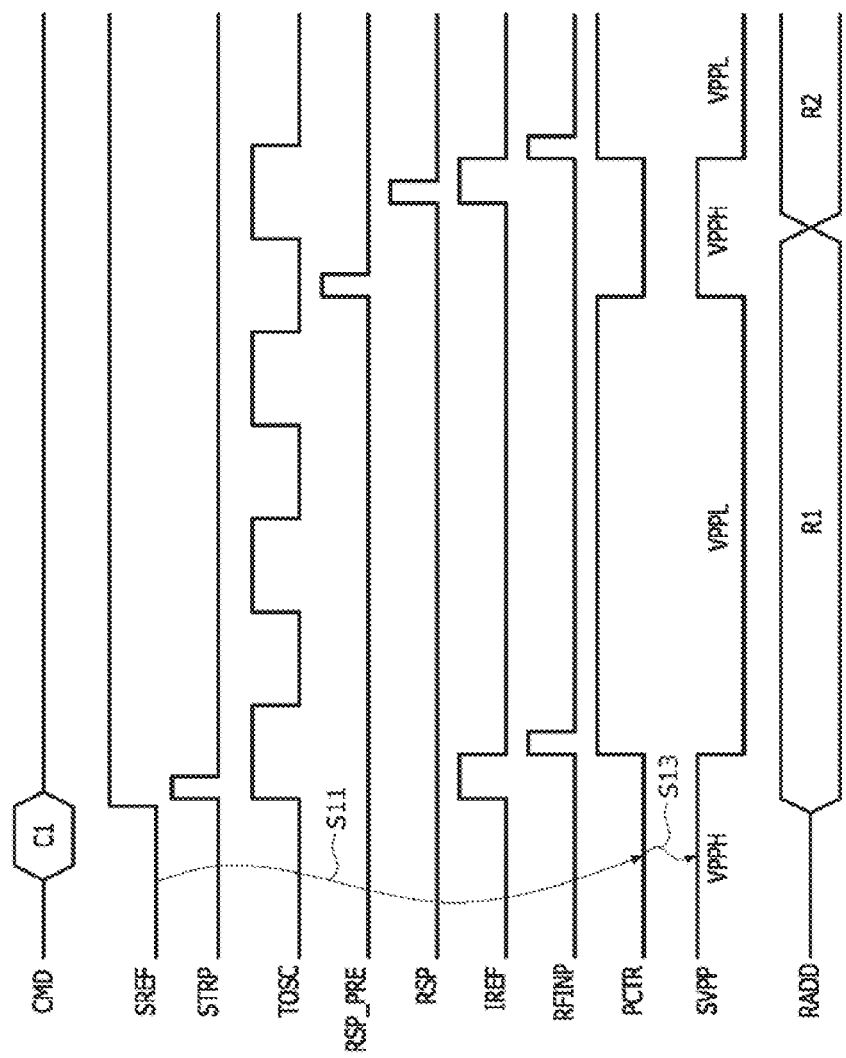
FIGS. 7 to 14 illustrate an operation of the device, illustrated in FIG. 2.
Figure 8:
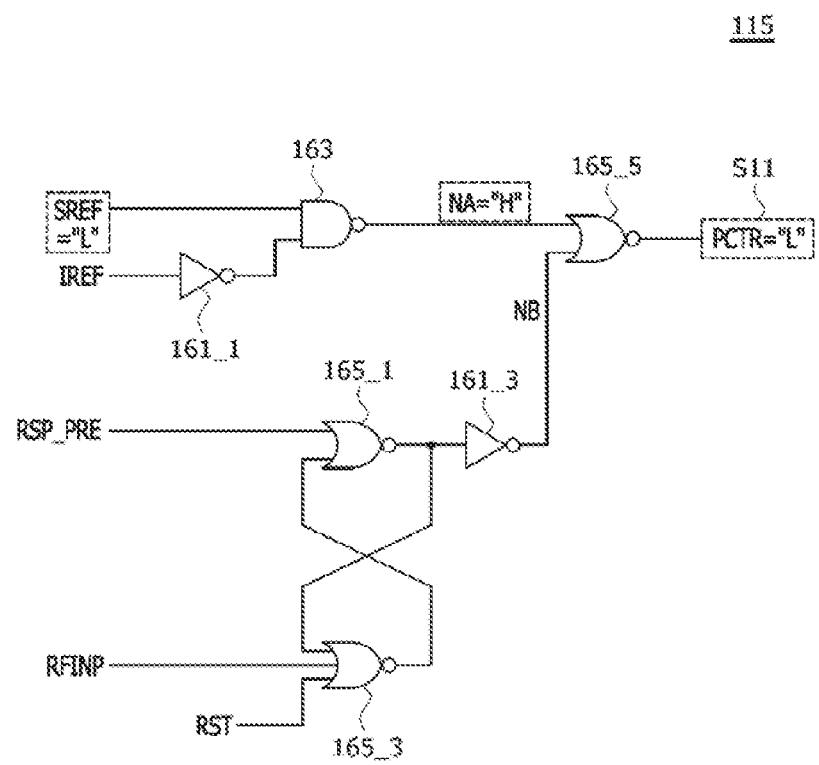

The operation of the device 103A will be described in detail hereinafter with reference to FIGS. 7 and 8 in conjunction with an embodiment in which the refresh signal SREF is deactivated to a logic "low" level before the refresh operation is performed. As illustrated in FIGS. 7 and 8, when the refresh signal SREF is deactivated to a logic "low" level, the first state signal NA may be set to a logic "high(H)" level and the drive control signal PCTR may be set to a logic "low(L)" level (see a path "S11" of FIG. 7). When the drive control signal PCTR has a logic "low(L)" level, the active voltage SVPP may be driven to have the first internal voltage VPPH (see a path "S13" of FIG. 7).

Figure 9:
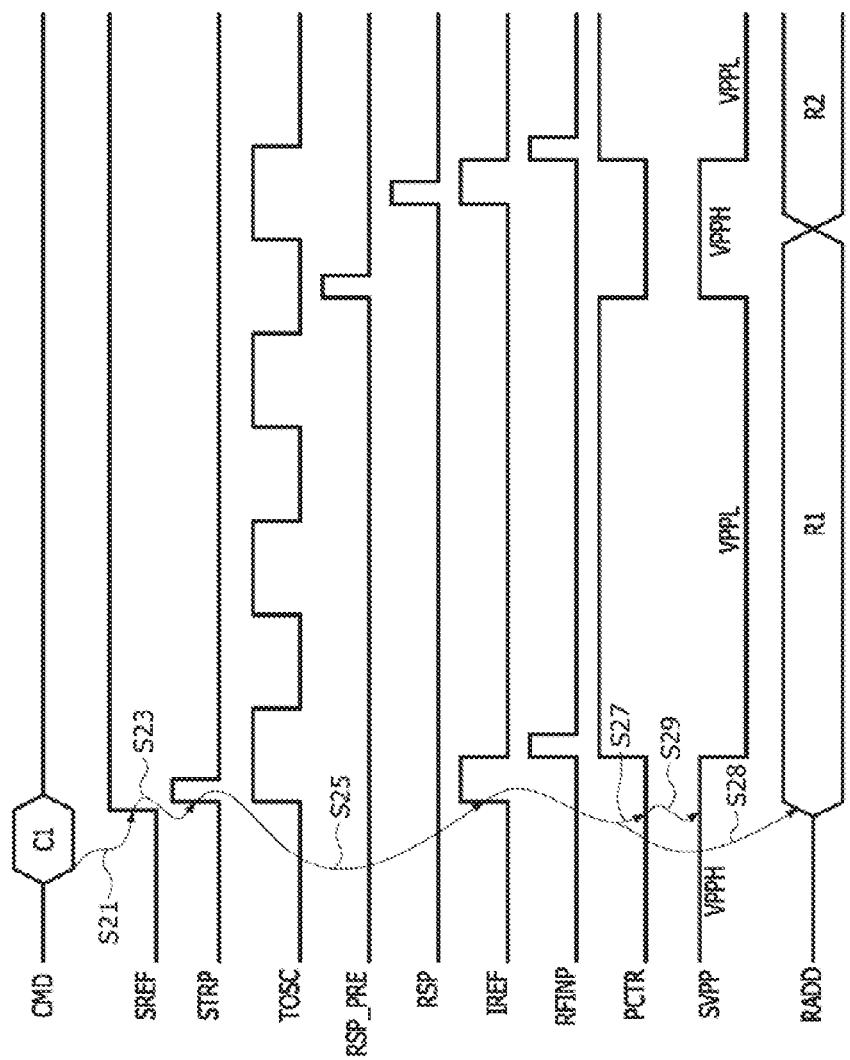
Figure 10:
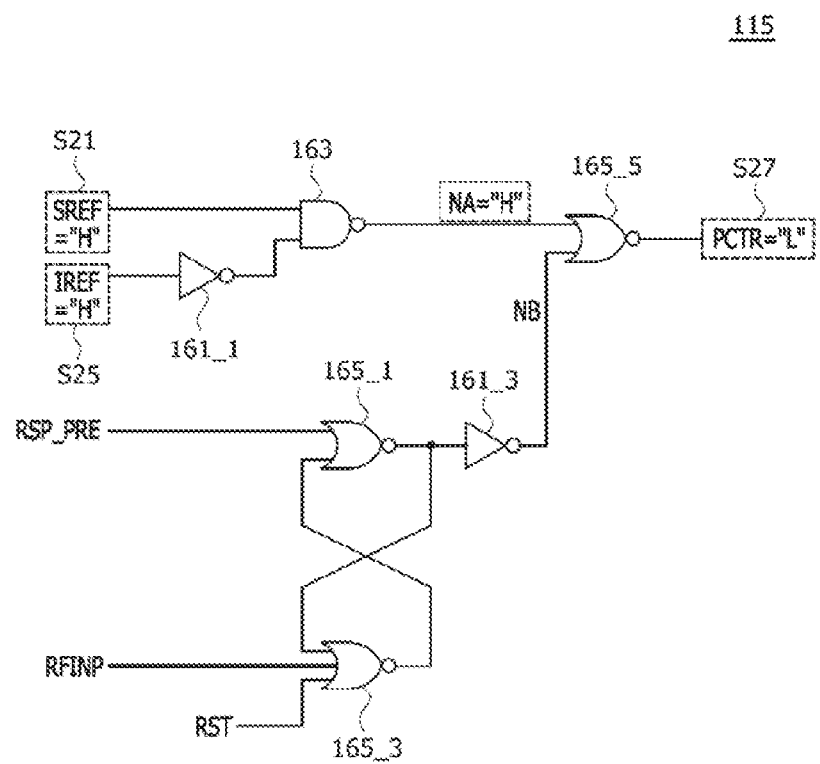

The operation of the device 103A will be described in detail hereinafter with reference to FIGS. 9 and 10 in conjunction with an embodiment in which the refresh signal SREF is activated to a logic "high" level for execution of the refresh operation. As illustrated in FIGS. 9 and 10, when the refresh signal SREF is activated to a logic "high" level in synchronization with the command CMD with a predetermined combination C1 (see a path "S21" of FIG. 9), the start pulse STRP may be generated (see a path "S23" of FIG. 9). When the start pulse STRP is generated, the internal refresh signal IREF may be activated to a logic "high" level (see a path "S25" of FIG. 9). When the internal refresh signal IREF is activated to a logic "high" level, the first state signal NA may be set to a logic "high(H)" level and the drive control signal PCTR may be set to a logic "low(L)" level (see a path "S27" of FIG. 9). When the internal refresh signal IREF is activated to a logic "high" level, the row address RADD may be counted to have the first combination R1 (see a path "S28" of FIG. 9). When the drive control signal PCTR has a logic "low(L)" level, the active voltage SVPP may be driven to have the first internal voltage VPPH (see a path "S29" of FIG. 9) and the active operation for a cell array that is coupled to a first word line selected by the row address RADD with the first combination R1 may be performed.

Figure 11:
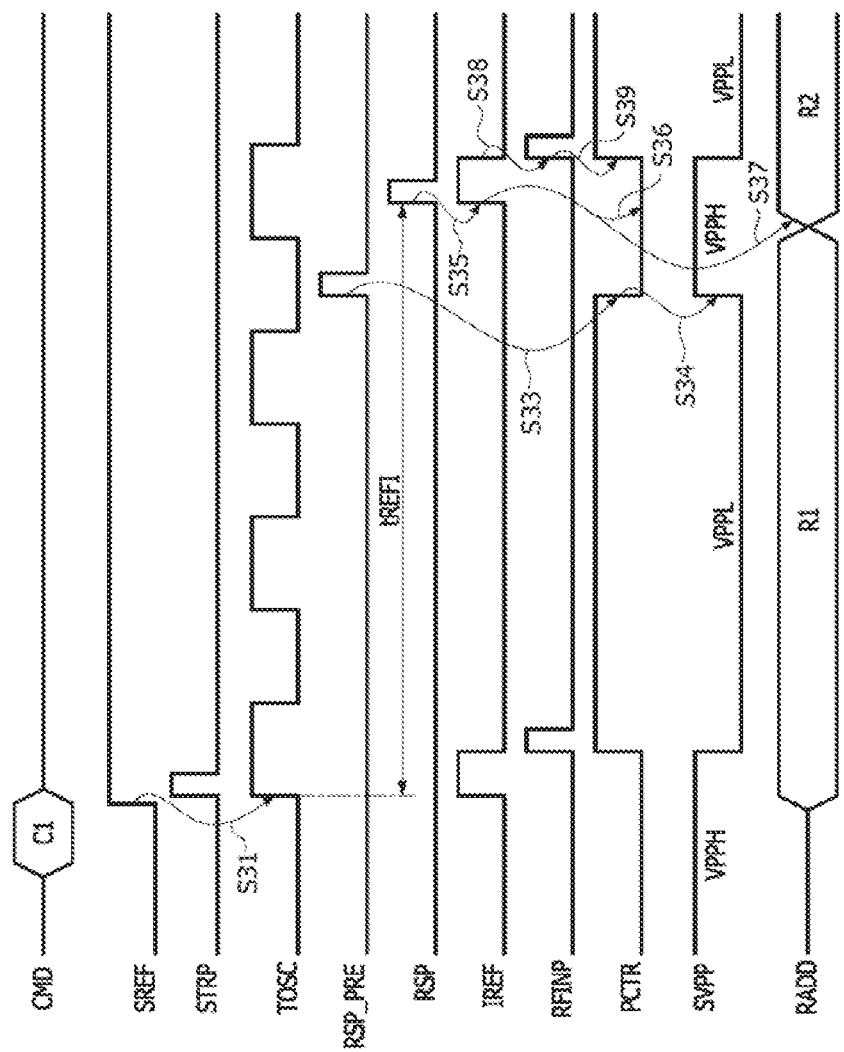
Figure 12:
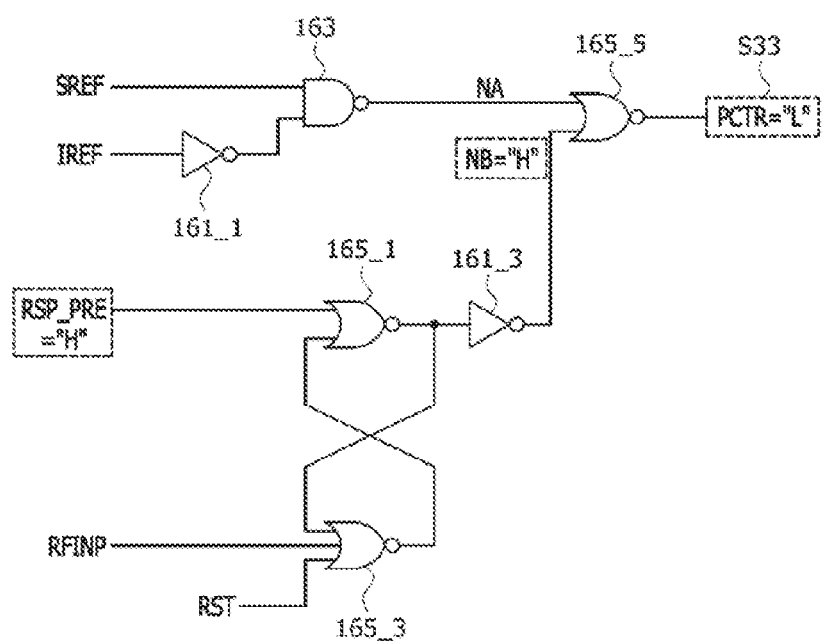
Figure 13:
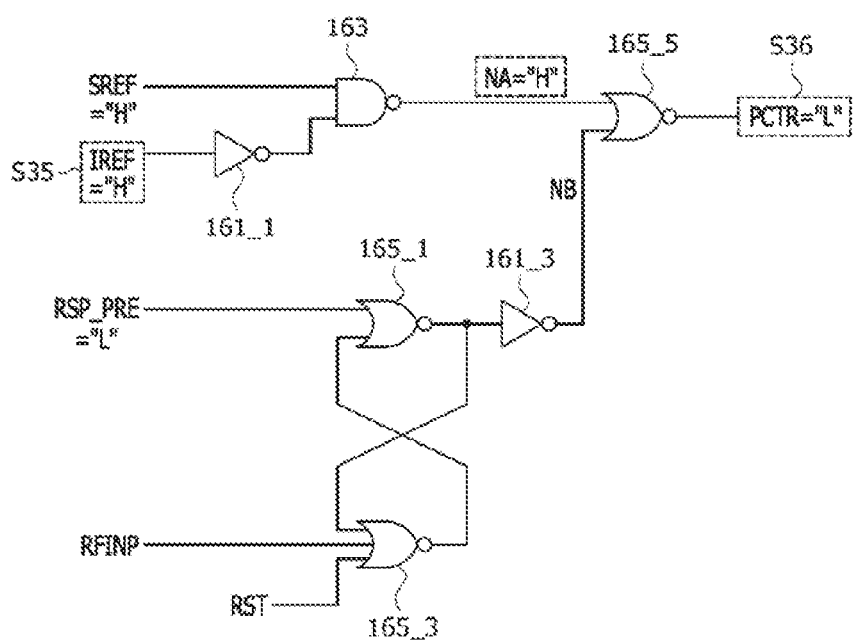
Figure 14:
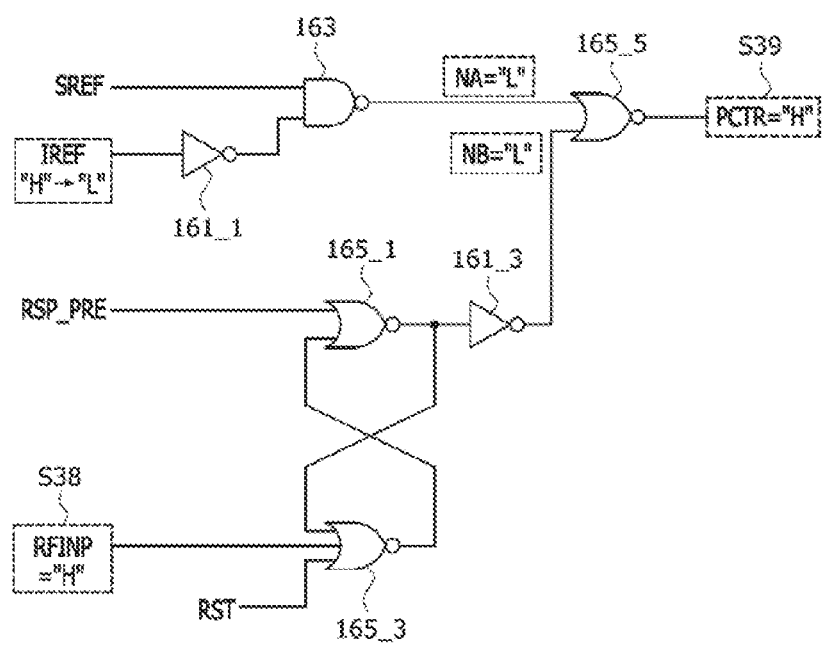

The operation that is performed by the device 103A during each internal refresh cycle after the refresh signal SREF is activated to a logic "high" level will be described in detail hereinafter with reference to FIGS. 11 to 14. As illustrated in FIGS. 11 and 12, when the refresh signal SREF is activated to a logic "high" level in synchronization with the command CMD with the predetermined combination C1, the refresh clock signal TOSC may be generated (see a path "S31" of FIG. 11). The refresh pulse RSP may be generated at a point in time in which an internal refresh cycle tREFI elapses from a point in time in which the refresh clock signal TOSC is generated. Although FIG. 1 illustrates an example in that the internal refresh cycle tREFI is greater than 3 cycles of the refresh clock signal TOSC, the present disclosure is not limited thereto. The refresh pulse RSP may be repeatedly generated at a point in time in which the internal refresh cycle tREFI elapses from a point in time in which the refresh clock signal TOSC is generated. The pre-refresh pulse RSP_PRE may be generated before the refresh pulse RSP is generated, and the point in time in which the pre-refresh pulse RSP_PRE is generated may be set to be different according to the embodiments. As illustrated in FIGS. 11 and 12, when the pre-refresh pulse RSP_PRE is generated to have a logic "high(H)" level, the drive control signal PCTR may be set to a logic "low(L)" level (see a path "S33" of FIG. 11), and the active voltage SVPP may be driven to have the first internal voltage VPPH (see a path "S34" of FIG. 11). Before the pre-refresh pulse RSP_PRE is generated to have a logic "high(H)" level, the drive control signal PCTR may be set to a logic "high(H)" level and the active voltage SVPP may be driven to have the second internal voltage VPPL. Thus, the current leakage of the device 103A may be reduced, and power consumption of the device 103A may also be reduced. As illustrated in FIGS. 11 and 13, when the refresh pulse RSP is generated to have a logic "high" level, the internal refresh signal IREF may be activated to a logic "high" level (see a path "S35" of FIG. 11). When the internal refresh signal IREF is activated to a logic "high" level, the first state signal NA may be set to a logic "high(H)" level and the drive control signal PCTR may maintain a logic "low" level (see a path "S36" of FIG. 11). When the internal refresh signal IREF is activated to a logic "high" level, the row address RADD may be counted to have the second combination R2 (see a path "S37" of FIG. 11). When the drive control signal PCTR has a logic "low(L)" level, the active voltage SVPP may be driven to have the first internal voltage VPPH and the active operation for a cell array that is coupled to a second word line selected by the row address RADD with the second combination R2 may be performed. As illustrated in FIGS. 11 and 14, the refresh end pulse RFINP may be generated to have a logic "high" level in synchronization with a point in time in which a level of the internal refresh signal IREF changes from a logic "high" level into a logic "low" level (see a path "S38" of FIG. 11). Due to the internal refresh signal IREF deactivated to a logic "low" level and the refresh end pulse RFINP generated to have a logic "high" level, both of the first and second state signals NA and NB may be set to a logic "low(L)" level and the drive control signal PCTR may be set to a logic "high (H)" level (see a path "S39" of FIG. 11). When the drive control signal PCTR is set to a logic "high(H)" level, the active voltage SVPP may be driven to have the second internal voltage VPPL to reduce the current leakage of the device 103A. Accordingly, power consumption of the device 103A may be reduced.

Figure 15:
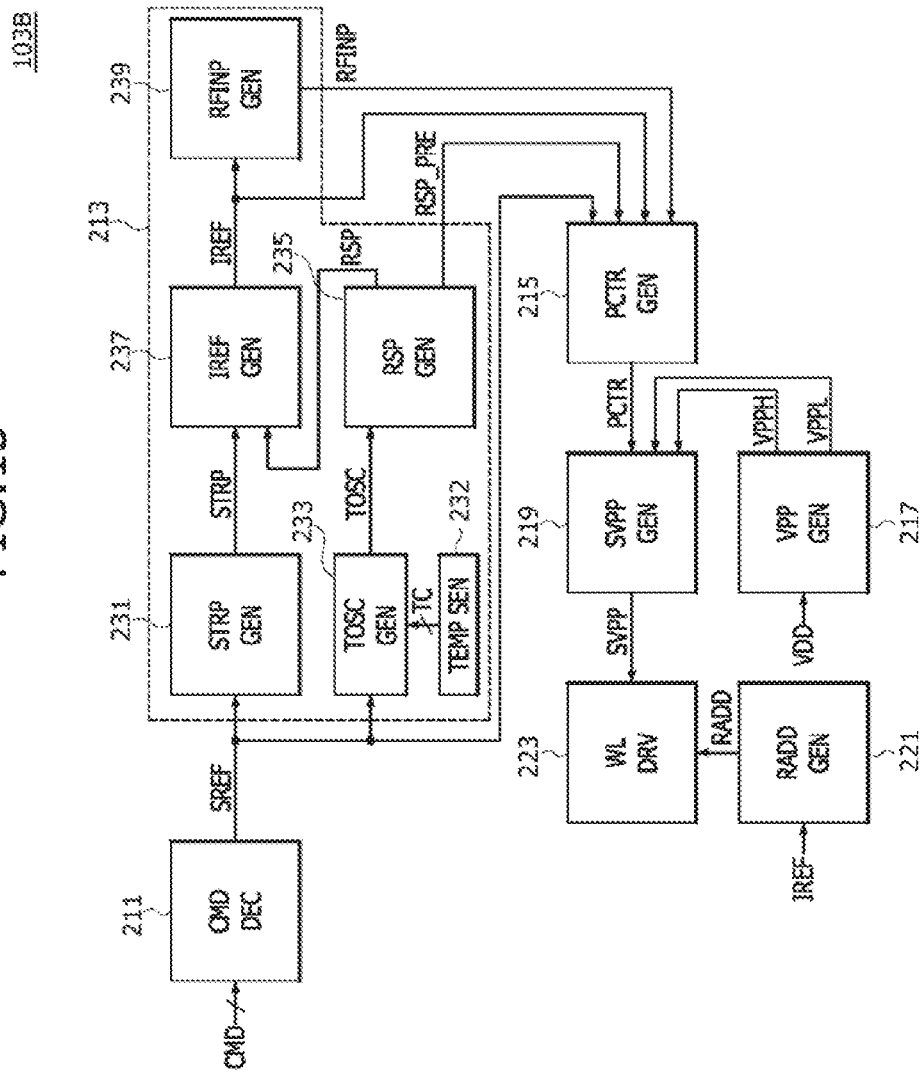
FIG. 15 is a block diagram, illustrating a configuration of another example of a device included in the system, illustrated in FIG. 1.

FIG. 15 is a block diagram, illustrating a configuration of a device 103B that corresponds to another example of the device 103, included in the system 10, illustrated in FIG. 1. As illustrated in FIG. 15, the device 103B may include a command decoder (CMD_DEC) 211, an operation control circuit 213, a drive control signal generation circuit (PCTR_GEN) 215, an internal voltage generation circuit (VPP_GEN) 217, an active voltage generation circuit (SVPP_GEN) 219, a row address generation circuit (RADD_GEN) 221, and a word line drive circuit (WL_DRV) 223.

The command decoder 211 may decode command CMD to generate a refresh signal SREF to perform a refresh operation. The command decoder 111 may generate the refresh signal SREF that is activated based on a logic level combination of bits that is included in the command CMD while the refresh operation is being performed. The command decoder 211 may be realized by using the same circuit as the command decoder 111, included in the device 103A, illustrated in FIG. 2.

The operation control circuit 213 may receive the refresh signal SREF from the command decoder 211. The operation control circuit 213 may generate an internal refresh signal IREF, a refresh pulse RSP, a pre-refresh pulse RSP_PRE, and a refresh end pulse RFINP based on the refresh signal SREF. The operation control circuit 213 may generate the internal refresh signal IREF that is activated to execute the active operation for a cell array that is accessed based on a row address RADD when the refresh signal SREF is activated. The operation control circuit 213 may generate a refresh clock signal TOSC, whose cycle is adjusted based on a temperature, when the refresh signal SREF is activated and may generate the refresh pulse RSP during each internal refresh cycle that is set by the refresh clock signal TOSC. The operation control circuit 213 may generate the internal refresh signal IREF that is activated to execute the active operation for a cell array that is accessed based on the row address RADD whenever the refresh pulse RSP is generated. The operation control circuit 213 may generate the pre-refresh pulse RSP_PRE before the refresh pulse RSP is generated during each internal refresh cycle that is set by the refresh clock signal TOSC. In an embodiment, the pre-refresh pulse RSP_PRE may be generated before the active operation for a cell array that is accessed by the row address RADD is performed. The operation control circuit 213 may generate the refresh end pulse RFINP when the active operation for a cell array terminates based on the internal refresh signal IREF.

The operation control circuit 213 may include a start pulse generation circuit (STRP_GEN) 231, a temperature sensor (TEMP_SEN) 232, a refresh clock generation circuit (TOSC_GEN) 233, a refresh pulse generation circuit (RSP_GEN) 235, an internal refresh signal generation circuit (IREF_GEN) 237, and a refresh end pulse generation circuit (RFINP_GEN) 239.

The start pulse generation circuit 231 may generate a start pulse STRP when the refresh signal SREF is activated. The start pulse generation circuit 231 may be realized by using the same circuit as the start pulse generation circuit 131 included in the device 103A illustrated in FIG. 2.

The temperature sensor 232 may sense an internal temperature of the device 103B to generate a temperature code TC. The temperature code TC may include a plurality of bits, and each of logic level combinations of the bits that are included in the temperature code TC may correspond to an internal temperature of the device 103B. For example, a first logic level combination of the temperature code TC may correspond to a first internal temperature T1 of the device 103B, and a second logic level combination of the temperature code TC may correspond to a second internal temperature T2 of the device 103B.

The refresh clock generation circuit 233 may receive the refresh signal SREF from the command decoder 211 and may receive the temperature code TC from the temperature sensor 232. The refresh clock generation circuit 233 may generate the refresh clock signal TOSC, whose cycle is adjusted based on the temperature code TC, when the refresh signal SREF is activated. A cycle of the refresh clock signal TOSC may be adjusted based on a logic level combination of bits included in the temperature code TC. For example, when the internal temperature T2 of the device 103B changes from the first internal temperature T1 into the second internal temperature T2 higher than the first internal temperature T1, a cycle of the refresh clock signal TOSC generated based on a second combination of the temperature code TC that corresponds to the second internal temperature T2 may be shorter than a cycle of the refresh clock signal TOSC generated based on a first combination of the temperature code TC corresponding to the first internal temperature T1.

The refresh pulse generation circuit 235 may receive the refresh clock signal TOSC from the refresh clock generation circuit 233. The refresh pulse generation circuit 235 may generate the refresh pulse RSP during each internal refresh cycle that is set by the refresh clock signal TOSC. The refresh pulse generation circuit 235 may generate the pre-refresh pulse RSP_PRE before the refresh pulse RSP is generated. The refresh pulse generation circuit 235 may be realized by using the same circuit as the refresh pulse generation circuit 135, included in the device 103A, illustrated in FIG. 2.

The internal refresh signal generation circuit 237 may receive the start pulse STRP from the start pulse generation circuit 231 and may receive the refresh pulse RSP from the refresh pulse generation circuit 235. The internal refresh signal generation circuit 237 may generate the internal refresh signal IREF that is activated when the start pulse STRP or the refresh pulse RSP is generated. The internal refresh signal generation circuit 237 may be realized by using the same circuit as the internal refresh signal generation circuit 137 included in the device 103A illustrated in FIG. 2.

The refresh end pulse generation circuit 239 may receive the internal refresh signal IREF from the internal refresh signal generation circuit 237. The refresh end pulse generation circuit 239 may generate the refresh end pulse RFINP when the active operations for cell arrays terminate based on the internal refresh signal IREF. The refresh end pulse generation circuit 239 may be realized by using the same circuit as the refresh end pulse generation circuit 139, included in the device 103A, illustrated in FIG. 2.

The drive control signal generation circuit 215 may receive the refresh signal SREF from the command decoder 211. The drive control signal generation circuit 215 may receive the pre-refresh pulse RSP_PRE from the refresh pulse generation circuit 235, may receive the internal refresh signal IREF from the internal refresh signal generation circuit 237, and may receive the refresh end pulse RFINP from the refresh end pulse generation circuit 239. The drive control signal generation circuit 215 may generate a drive control signal PCTR based on the refresh signal SREF, the pre-refresh pulse RSP_PRE, the internal refresh signal IREF, and the refresh end pulse RFINP. The drive control signal generation circuit 215 may be realized by using the same circuit as the drive control signal generation circuit 115, included in the device 103A, illustrated in FIG. 2.

The internal voltage generation circuit 217 may generate a first internal voltage VPPH and a second internal voltage VPPL based on a power supply voltage VDD. The internal voltage generation circuit 217 may be realized by using the same circuit as the internal voltage generation circuit 117, included in the device 103A, illustrated in FIG. 2.

The active voltage generation circuit 219 may receive the drive control signal PCTR from the drive control signal generation circuit 215. The active voltage generation circuit 219 may generate an active voltage SVPP that is driven to the first internal voltage VPPH or the second internal voltage VPPL based on the drive control signal PCTR. The active voltage generation circuit 219 may drive the active voltage SVPP to the second internal voltage VPPL lower than the first internal voltage VPPH while no active operation is being performed, thereby reducing power consumption of the device 103B. That is, it may be possible to reduce an amount of current leakage such as a junction current leakage due to a gate induced drain leakage (GIDL) phenomenon of cell transistors included in the device 103B. The active voltage generation circuit 219 may be realized by using the same circuit as the active voltage generation circuit 119, included in the device 103A, illustrated in FIG. 2.

The row address generation circuit 221 may receive the internal refresh signal IREF from the internal refresh signal generation circuit 237. The row address generation circuit 221 may generate the row address RADD based on the internal refresh signal IREF. The row address generation circuit 221 may generate the row address RADD that is sequentially counted whenever the internal refresh signal IREF is activated. The row address generation circuit 221 may be realized by using the same circuit as the row address generation circuit 121, included in the device 103A, illustrated in FIG. 2.

The word line drive circuit 223 may receive the active voltage SVPP from the active voltage generation circuit 219 and may receive the row address RADD from the row address generation circuit 221. The word line drive circuit 223 may supply the active voltage SVPP to a certain word line to perform the active operation for a cell array that is coupled to the certain word line that is selected by the row address RADD. The word line drive circuit 223 may be realized by using the same circuit as the word line drive circuit 123, included in the device 103A, illustrated in FIG. 2.

Figure 16:
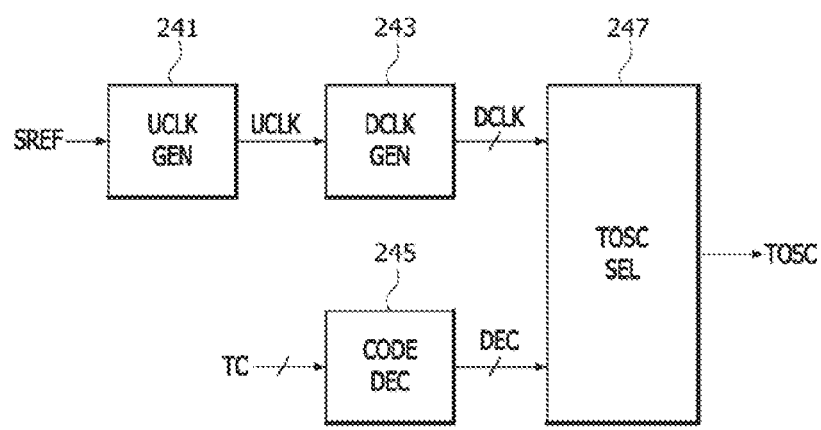
FIG. 16 is a block diagram, illustrating an example of a refresh clock generation circuit, included in the device, illustrated in FIG. 15.

FIG. 16 is a block diagram, illustrating a configuration of the refresh clock generation circuit 233. As illustrated in FIG. 16, the refresh clock generation circuit 233 may include a unit clock generation circuit (UCLK_GEN) 241, a division clock generation circuit (DCLK_GEN) 243, a code decoder (CODE_DEC) 245, and a refresh clock selection circuit (TOSC_SEL) 247.

The unit clock generation circuit 241 may receive the refresh signal SREF from the command decoder 211. The unit clock generation circuit 241 may generate a unit clock signal UCLK when the refresh signal SREF is activated to perform the refresh operation. A cycle of the unit clock signal UCLK may be set to be equal to a predetermined unit cycle, and the predetermined unit cycle may be set to be different according to the embodiments.

The division clock generation circuit 243 may receive the unit clock signal UCLK from the unit clock generation circuit 241. The division clock generation circuit 243 may divide the unit clock signal UCLK to generate a division clock signal DCLK. In the present embodiment, the division clock signal DCLK may include "M"-division clock signals of the unit clock signal UCLK. In the "M"-division clock signals, the number "M" may be set as a natural number that is equal to or greater than two. For example, the division clock signal DCLK may include a 2-division clock signal of the unit clock signal UCLK, a 4-division clock signal of the unit clock signal UCLK, and an 8-division clock signal of the unit clock signal UCLK.

The code decoder 245 may receive the temperature code TC from the temperature sensor 232. The code decoder 245 may decode the temperature code TC to generate a decoded signal DEC. The number of bits included in the decoded signal DEC may be set to be greater than the number of bits included in the temperature code TC. A logic level combination of the bits included in the decoded signal DEC may correspond to one of various internal temperatures of the device 103B.

The refresh clock selection circuit 247 may receive the division clock signal DCLK from the division clock generation circuit 243 and may receive the decoded signal DEC from the code decoder 245. The refresh clock selection circuit 247 may select one of the "M"-division clock signals of the unit clock signal UCLK that is included in the division clock signal DCLK based on a logic level combination of the decoded signal DEC to output the selected division clock signal as the refresh clock signal TOSC. A cycle of the refresh clock signal TOSC may be adjusted to increase by "M" times a cycle of the unit clock signal UCLK when the internal temperature of the device 103B is lowered.

According to the embodiments, an active voltage that is supplied to a word line, coupled to the accessed cell, may be boosted to reduce power consumption that is necessary to drive the active voltage during the refresh operation only when an active operation for a cell that is accessed during a refresh operation is performed.

In addition, when the active operation for the accessed cell is not performed during the refresh operation, the active voltage may be lowered to reduce the amount of current leakage of the accessed cell.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

What is claimed is:

1. A device comprising:
   an operation control circuit configured to generate an internal refresh signal that is activated to perform an active operation for a cell array, the cell array being coupled to a word line that is selected by a row address based on a refresh signal that is activated to perform a refresh operation, configured to generate a pre-refresh pulse based on the refresh signal, and configured to generate a refresh end pulse based on the internal refresh signal;
   a drive control signal generation circuit configured to generate a drive control signal to control a drive of an active voltage that is supplied to the word line that is selected by the row address, based on the internal refresh signal, the pre-refresh pulse, and the refresh end pulse; and
   an active voltage generation circuit that is configured to drive the active voltage to the first internal voltage when the drive control signal has a first logic level and configured to drive the active voltage to the second internal voltage when the drive control signal has a second logic level.

2. The device of claim 1, wherein the operation control circuit includes a start pulse generation circuit that is configured to generate a start pulse when the refresh signal is activated.

3. The device of claim 2, wherein the operation control circuit further includes a refresh pulse generation circuit that is configured to generate a refresh pulse during each internal refresh cycle that is set based on a refresh clock signal that is generated when the refresh signal is activated and configured to generate the pre-refresh pulse before the refresh pulse is generated.

4. The device of claim 3, wherein a cycle of the refresh clock signal is set to be constant.

5. The device of claim 3, wherein a cycle of the refresh clock signal is adjusted based on an internal temperature of the device.

6. The device of claim 3, wherein the operation control circuit further includes an internal refresh signal generation circuit that is configured to generate the internal refresh signal that is activated when the start pulse or the refresh pulse is generated.

7. The device of claim 6, wherein the operation control circuit further includes a refresh end pulse generation circuit that is configured to generate the refresh end pulse in synchronization with a point in time in which the internal refresh signal is deactivated.

8. The device of claim 1, wherein the drive control signal generation circuit is configured to generate the drive control signal to boost a level of the active voltage when the refresh signal is deactivated or both of the refresh signal and the internal refresh signal are activated.

9. The device of claim 1, wherein the drive control signal generation circuit is configured to generate the drive control signal to boost a level of the active voltage during a period from a point in time in which the pre-refresh pulse is generated until a point in time in which the refresh end pulse is generated while the refresh signal is activated.

10. The device of claim 1, wherein the first internal voltage is set to be higher than the second internal voltage.

11. The device of claim 1, wherein the drive control signal generation circuit is configured to generate the drive control signal with the first logic level when the refresh signal is deactivated, configured to generate the drive control signal with the first logic level when both of the refresh signal and the internal refresh signal are activated, and configured to generate the drive control signal with the first logic level during a period from a point in time in which the pre-refresh pulse is generated until a point in time in which the refresh end pulse is generated while the refresh signal is activated.

12. The device of claim 1, further comprising:
a row address generation circuit configured to generate the row address based on the internal refresh signal; and
a word line drive circuit configured to supply the active voltage to the word line that is selected by the row address.

13. A device comprising:
a refresh pulse generation circuit configured to generate a refresh pulse during each internal refresh cycle that is set based on a refresh clock signal that is generated when a refresh signal is activated and configured to generate a pre-refresh pulse before the refresh pulse is generated;
an internal refresh signal generation circuit configured to generate an internal refresh signal based on a start pulse that is generated when the refresh signal is activated and the refresh pulse;
a refresh end pulse generation circuit configured to generate a refresh end pulse based on the internal refresh signal; and
a drive control signal generation circuit configured to generate a drive control signal to control a drive of an active voltage that is supplied to a word line that is selected by a row address based on the internal refresh signal, the pre-refresh pulse, and the refresh end pulse.

14. The device of claim 13, wherein a cycle of the refresh clock signal is adjusted based on an internal temperature of the device.

15. The device of claim 13, wherein the refresh end pulse is generated in synchronization with a point in time in which the internal refresh signal is deactivated.

16. The device of claim 13, further comprising an active voltage generation circuit that is configured to drive the active voltage to a first internal voltage when the drive control signal has a first logic level and configured to drive the active voltage to a second internal voltage when the drive control signal has a second logic level.

17. The device of claim 16, wherein the first internal voltage is set to be higher than the second internal voltage.

18. The device of claim 16, wherein the drive control signal generation circuit is configured to generate the drive control signal with the first logic level when the refresh signal is deactivated, configured to generate the drive control signal with the first logic level when both of the refresh signal and the internal refresh signal are activated, and configured to generate the drive control signal with the first logic level during a period from a point in time in which the pre-refresh pulse is generated until a point in time in which the refresh end pulse is generated while the refresh signal is activated.

19. A device comprising:
a refresh clock generation circuit configured to generate a refresh clock signal, whose cycle is adjusted based on a temperature code when a refresh signal is activated;
a refresh pulse generation circuit configured to generate a refresh pulse during each internal refresh cycle that is set based on the refresh clock signal and configured to generate a pre-refresh pulse before the refresh pulse is generated;
an internal refresh signal generation circuit configured to generate an internal refresh signal based on a start pulse that is generated when the refresh signal is activated and the refresh pulse;
a refresh end pulse generation circuit configured to generate a refresh end pulse based on the internal refresh signal; and
a drive control signal generation circuit configured to generate a drive control signal to control a drive of an active voltage that is supplied to a word line that is selected by a row address based on the internal refresh signal, the pre-refresh pulse, and the refresh end pulse.

* * * * *